(12) United States Patent
Udrea et al.

(10) Patent No.: US 10,128,302 B2
(45) Date of Patent: Nov. 13, 2018

(54) IR DETECTOR ARRAY DEVICE

(71) Applicant: AMS SENSORS UK LIMITED, Cambridge (GB)

(72) Inventors: Florin Udrea, Cambridge (GB); Syed Zeeshan Ali, Cambridge (GB); Richard Henry Hopper, Cambridge (GB); Julian Gardner, Kineton (GB); Andrea De Luca, Cambridge (GB)

(73) Assignee: AMS SENSORS UK LIMITED, Cambridge (GB)

( * ) Notice: Subject to any disclaimer, the term of this patent is extended or adjusted under 35 U.S.C. 154(b) by 0 days.

(21) Appl. No.: 15/009,410

(22) Filed: Jan. 28, 2016

(65) Prior Publication Data

US 2017/0221959 A1    Aug. 3, 2017

(51) Int. Cl.
*H01L 27/16* (2006.01)
*H01L 27/146* (2006.01)
(Continued)

(52) U.S. Cl.
CPC ........ *H01L 27/14669* (2013.01); *G01J 5/024* (2013.01); *G01J 5/12* (2013.01); *G01J 5/20* (2013.01); *H01L 27/1462* (2013.01); *H01L 27/1463* (2013.01); *H01L 27/14603* (2013.01); *H01L 27/14609* (2013.01); *H01L 27/14612* (2013.01); *H01L 27/14618* (2013.01); *H01L 27/14625* (2013.01); *H01L 27/14629* (2013.01); *H01L 27/14649* (2013.01); *H01L 27/14683* (2013.01); *H01L 27/16* (2013.01); *H01L 31/024* (2013.01); *H01L 31/028* (2013.01); *H01L 31/09* (2013.01); *H01L 31/103* (2013.01); *H01L 31/112* (2013.01); *H01L 31/12* (2013.01); *H01L 37/025* (2013.01); *G01J 2005/123* (2013.01); *G01J 2005/202* (2013.01)

(58) Field of Classification Search
CPC ......... H01L 27/14669; H01L 27/14603; H01L 27/14609; H01L 27/14612; H01L 27/14618

See application file for complete search history.

(56) References Cited

U.S. PATENT DOCUMENTS

| 6,040,579 | A | 3/2000 | Münch |
| 7,005,644 | B2 | 2/2006 | Ishikawa |

(Continued)

FOREIGN PATENT DOCUMENTS

| DE | 9209183 U1 | 9/1992 |
| EP | 1413861 B1 | 9/2010 |

OTHER PUBLICATIONS

Graf, A., et al., "Review of micromachined thermopiles for infrared detection", IOP Publishing, Measurement Science and Technology 18, May 9, 2007, pp. R59-R75.

(Continued)

*Primary Examiner* — Marcus Taningco
(74) *Attorney, Agent, or Firm* — Tucker Ellis LLP (57) ABSTRACT

We disclose herein a thermal IR detector array device comprising a dielectric membrane, supported by a substrate, the membrane having an array of IR detectors, where the array size is at least 3 by 3 or larger, and there are tracks embedded within the membrane layers to separate each element of the array, the tracks also acting as heatsinks and/or cold junction regions.

60 Claims, 8 Drawing Sheets

(51) Int. Cl.
- *H01L 31/024* (2014.01)
- *H01L 31/028* (2006.01)
- *H01L 31/09* (2006.01)
- *H01L 31/103* (2006.01)
- *H01L 31/112* (2006.01)
- *H01L 31/12* (2006.01)
- *H01L 37/02* (2006.01)
- *G01J 5/02* (2006.01)
- *G01J 5/12* (2006.01)
- *G01J 5/20* (2006.01)

(56) References Cited

U.S. PATENT DOCUMENTS

| | | | |
|---|---|---|---|
| 7,842,922 B2 | 11/2010 | Leneke | |
| 8,441,093 B2 | 5/2013 | Barlow | |
| 8,552,380 B1 * | 10/2013 | Florin | G01J 5/12 250/338.4 |
| 2014/0040592 A1 | 3/2004 | Shneider | |
| 2009/0072284 A1 * | 3/2009 | King | H01L 27/14632 257/292 |
| 2009/0261445 A1 | 10/2009 | Sugino | |
| 2011/0248374 A1 * | 10/2011 | Akin | G01J 5/20 257/470 |
| 2012/0061569 A1 * | 3/2012 | Noguchi | G01J 5/024 250/338.3 |
| 2014/0036953 A1 * | 2/2014 | Kimura | G01J 5/16 374/121 |

OTHER PUBLICATIONS

Kim, Jae-Kwan, et al., "A new uncooled thermal infrared detector using silicon diode", Sensors and Actuators A 89, (2001), pp. 22-27.

Hirota, Masaki, et al., "120×90 Element Thermopile Array Fabricated with CMOS Technology", Proc. of SPIE, vol. 4820, (2003), pp. 239-249.

Sarro, P. M., et al., "An Integrated Thermal Infrared Sensing Array", Sensors and Actuators, 14 (1988), pp. 191-201, Dec. 3, 1987.

Jones, C.D.W., et al., "MEMS thermal imager with optical readout", Sensors and Actuators A 155 (2009), pp. 47-57.

Foote, Marc C., et al., "High performance micromachined thermopile linear arrays", SPIE, vol. 3379, Apr. 1998, pp. 192-197.

Calaza, C., et al., "An uncooled infrared focal plane array for low-cost applications fabricated with standard CMOS technology", Sensors and Actuators A 132 (2006) pp. 129-138, Jul. 17, 2006.

Kanno, Toshio, et al., "Uncooled infrared focal plane array having 128×128 thermopile detctactor elements", SPIE, vol. 2269 (1994), pp. 450-459.

Baer, Wayne G., et al., "A 32-element micromachined thermal imager with on-chip multiplexing", Sensors and Actuators A 48 (1995), pp. 47-54.

Kessler, E., et al., "A 256 pixel linear thermopile array using materials with high thermoelectric efficiency", IEEE, 16th International Conference on Thermoelectrics (1997), pp. 734-737.

Dillner, U., et al., "A 64-pixel linear thermopile array chip designed for vacuum environment", Proceedings of IRS$^2$ 2006, Nürnberg, May 30-31, 2006.

Schaufelbuehl, A., et al., "256-Pixel CMOS-Integrated Thermoelectric Infrared Sensor Array", IEEE (2001), pp. 200-203.

Oliver, Andrew D., et al., "A 1024-element bulk-micromachined thermopile infrared imaging array", Sensors and Actuators 73 (1999), pp. 222-231, Oct. 29, 1998.

Rubio, R., et al., "Thermopile sensor array for an electronic nose integrated non-selective NDIR gas detection system", IEEE (2005), pp. 503-505.

Invitation to pay Additional Fees from corresponding International Application No. PCT/GB2017/050176, dated May 17, 2017.

* cited by examiner

IR DETECTOR ARRAY DEVICE

FIELD OF THE INVENTION

This invention relates to an Infra-Red (IR) detector array device, particularly but not exclusively, to micro-machined thermal Infrared detector arrays.

BACKGROUND OF THE INVENTION

Micro-machined thermal infrared (IR) detectors are a well-established technology, and are typically based on thermopiles, bolometers, pyrodetectors or even diodes. These typically include of a structure thermally insulated from the substrate (such as a membrane or micro-bridge) which heats up due to incident IR radiation, and this change in temperature is detected using various methods. For example Graf et al. "Review of micromachined thermopiles for infrared detection" Meas. Sci. Technol. 18 (2007) R59-R75 reviews several thermopile based IR detectors which are typically on a membrane. Kim et al., "A new uncooled thermal infrared detector using silicon diode," Sensors and Actuators A 89 (2001), pp. 22-27, discusses a diode on a micro-bridge membrane used for IR radiation measurement.

It is also well known to fabricate arrays of IR detectors. For example, Hirota et al., "120×90 Element thermopile array fabricated with CMOS technology," Proceedings of SPIE Vol. 4820 (2003) pp. 239-249 describe an array of thermopile IR detectors, where each IR detector pixel is a separate front-side etched membrane.

Sarro et al., "An integrated thermal infrared sensing array," Sensors and Actuators 14 (1998) pp. 191-201, describe a linear 8-element thermopile array where each IR detector is on a cantilever structure. Jones et al., "MEMS thermal imager with optical readout", Sensors and actuators A 155 (2009), pp. 47-57, describe a two dimensional array where each detector is on a cantilever.

Foote et al., "High performance micromachined thermopile linear arrays," SPIE Vol. 3379, 1998, pp. 192-197, describe a linear array with each thermopile IR detector on a micro-bridge.

Calaza et al., "An uncooled infrared focal plane array for low-cost applications fabricated with standard CMOS technology," Sensors and Actuators A 132 (2006) pp. 129-138, describe a two dimensional IR detector array, where each detector is on a suspended membrane/microbridge structure.

Kanno et al., "Uncooled infrared focal plane array having 128×128 thermopile detector elements," SPIE Vol. 2269, pp. 450-459 describe a 128×128 IR detector array, where each element is on a suspended membrane/diaphragm.

U.S. Pat. No. 7,842,922 describes an IR detector array based on thermopiles, where each element is on membrane.

U.S. Pat. No. 7,005,644 describes an IR detector array based on diodes, where each element is on a separate micro-bridge type structure.

In each of these examples, the individual element of the array is on its own separate membrane/cantilever/diaphragm structure. These structures usually cannot be made very small, and as a result the pixel size tends to be large. This results in the overall array occupying a large chip area and is costly.

However, a number of linear arrays with 1 or 2 rows are known in literature. For example:

Baer et al., "A 32-element micromachined thermal imager with on-chip multiplexing" Sensors and Actuators A 48 (1995) pp. 47-54 described a 2×16 IR detector array on a single membrane.

Kessler et al., "A 256 pixel linear thermopile array using materials with high thermoelectric efficiency," Proceedings of Thermoelectrics 1997, pp. 734-737, and Dillner et al., "A 64-pixel linear thermopile array chip designed for vacuum environment," Proceedings of IRS$^2$ 2006, pp. 295-300, both describe linear arrays.

EP1413861B1 describes a linear array with only one row, having all the detectors on a single membrane.

U.S. Pat. No. 8,441,093 describes linear arrays of detectors based on thermopiles all on the same membrane, where the cold junction is on the substrate. It also shows a circular membrane with thermopiles placed radially, with the cold junctions on the substrate. In this case as well, the array cannot have a large number of pixels as cold junction connection to the substrate is needed.

These structures are possible as with a 1 or 2 row array of IR detectors on the same membrane, there is a substrate region next to each pixel which is cooler than the pixel area. For example, if using a thermopile based detector, the substrate region can be used as the cold junction region. However, for an array including 3 or more rows, the rows in the centre do not have access to the substrate region. For example, EP1413861 describes an array of detectors including of several rows, but they are made with each two row on a single membrane to allow a cold junction on the substrate for the thermopile.

In the above documents, it still requires several membranes for a large number of rows.

U.S. Pat. No. 6,040,579 and Schaufelbuehl et al., "256-Pixel CMOS-Integrated Thermoelectric Infrared Sensor Array" Proceedings of MEMS 2001, pp. 200-203, describe an array of thermopile IR detectors all on the same membrane, and use gold on top of the membrane to separate each pixel and act as the heat sink.

Similarly, Oliver et al., "A 1024-element bulk-micromachined thermopile infrared imaging array," Sensors and Actuators 73 (1999) pp. 222-231, describe a two-dimensional array on a single membrane, where the device thermal isolation is performed by the use of thick silicon underneath the membrane.

Rubio et al., "Thermopile sensor array for an electronic nose integrated non-selective NDIR gas detection System," Proceedings of Spanish Conference on Electron Devices 2005, pp. 503-505, describe a two dimensional IR detector array on a single membrane, using silicon below the membrane to provide the cold junction for the thermopiles.

In these cases a single membrane is used for the entire array. However, in case of using silicon underneath the membrane as a heatsink, the etching process is much more complicated. Additionally, the silicon heat sinks cannot be made very small, hence the spacing between pixels is large.

In the case of using gold tracks on top of the membrane, gold is not CMOS compatible, and this results in a non-standard process and increased fabrication cost.

SUMMARY

Aspects and preferred features are set out in the accompanying claims.

According to one aspect of the present invention there is provided an infra-red (IR) detector array device comprising:
 a two dimensional array of a plurality of IR detectors;
 a dielectric membrane formed on a semiconductor substrate which comprises an etched portion;
 a plurality of separator regions formed within the dielectric membrane;

wherein at least some of the plurality of IR detectors are formed on or within the dielectric membrane, and wherein said at least some of the plurality of IR detectors are separated from one another by at least some of said plurality of separator regions.

The separator regions may be more thermally conductive than the dielectric membrane. In one embodiment, the separator region comprises at least one layer that is thermally more conductive (or has higher thermal conductivity) than the dielectric membrane (or than the dielectric layers in the dielectric membrane).

The two dimensional array may comprise at least a 3 by 3 array. The size of the array may be larger than the 3 by 3 array. In general the design of a 3×3 or large array requires more than one membrane as the pixels in the centre do not have access to the substrate to form a temperature difference required for thermal IR detection. This increases the overall chip area. However, in this invention, the a 3×3 or larger array can be made on a single membrane, using the separate regions within the membrane dielectric layers which act as the heat sink, or cold junction region. This results in smaller chip size and lower cost.

The separator regions are thermally more conductive than the dielectric membrane and may be two dimensionally formed within the dielectric membrane. The separator regions may comprise at least two first separator regions extending in a first direction and at least two second separator regions extending in a second direction transverse to the first direction, the second separator regions intersecting the first separator regions.

The at least some of the plurality of IR detectors may be spaced from one another by said at least two first separator regions and by said at least two second separator regions.

Two adjacent IR detectors may be separated from one another by the first and second separator regions.

Some of the at least of some of the IR detectors are not separated from one another by the first and second separator regions. In this example, at least two adjacent IR detectors may be coupled directly with one another without having any separator regions between them. In one embodiment, at least two detectors are located within one pixel of the array device.

The separator regions each may comprise at least one separator layer. The at least one separator layer comprises at least one layer of metal, polysilicon and/or single crystal silicon. The at least one separator layer may comprise at least one layer of interconnect material to connect the IR detectors within the array of the IR detectors.

Each IR detector may form a pixel of the device. Each pixel can have at least one IR detector. The separator regions may each provide thermal isolation between each pixel of the device.

The IR detectors or pixels comprise any one or more of a thermopile, a resistor, transistor and a diode. It is possible that each pixel has a combination of two or more of a thermopile, a resistor, a transistor and a diode.

According to the embodiments of the invention, there is provided a two-dimensional infrared detector array of a size 3×3 or larger, where all the detectors are on the same membrane and separated by at least one layer of metal, polysilicon and/or single crystal silicon within the separator regions and embedded within the dielectric membrane. The membrane includes one or more dielectric materials supported on a substrate, and the membrane is thermally isolated from the substrate by bulk etching.

The IR detectors can be a thermopile, a diode, a transistor, or a resistor. The metal, polysilicon and/or single crystal silicon layers/tracks may form a thermal isolation between each pixel and can also be considered as a heat sink region, while the rest of the pixel area can be considered the hot region. The heat sink region may also contain interconnects to connect to the IR detectors within the array.

In the case of a thermopile, it includes one or more thermocouples connected in series. Each thermocouple includes two dissimilar materials which form a junction at the hot region of the pixel (to form the hot junction), while the other ends of the materials are in the heat sink region where they are connected electrically to the adjacent thermocouple to form the cold junction.

For the pixels at the edge of the membrane, some of the cold junctions will be formed outside the membrane on the substrate area.

The thermocouple materials may include metal such as Al, Copper, Tungsten, Titanium or combination of those, doped polysilicon (n or p type) or doped single crystal silicon (n or p type). In the example that both the material are polysilicon and/or single crystal silicon, a metal link may be used to form the junctions between them.

In the example of using diode detectors or transistor based, each pixel will have one diode in the centre, or more than one diode connected in series in the centre. The diode can be made of polysilicon or of single crystal silicon. The transistor can be made of single crystal silicon. Each pixel may also have a reference diode or transistor in the heat sink region.

In the example of using a resistor as a detector, each pixel will have a resistor in the centre. The resistor can be made of metal such as Al, Copper, Tungsten, titanium, Platinum, polysilicon (n or p type) or single crystal silicon (n or p type). The resistance of such resistors will change with a change in temperature. There can also be a reference resistor in the heat sink area of each pixel.

Alternately, the IR detection can be done by a combination of different sensor types. For example, a thermopile, where both the Seebeck effect, and the resistance change effect is used to determine the IR radiation. Alternatively for example the thermopile uses a reference diode for the cold junction temperature estimation in order to determine the absolute temperature in the hot junction.

The dielectric membrane may comprise:
  a membrane cavity comprising vertical side walls or sloping side walls;
  one or more dielectric layers comprising silicon dioxide and/or silicon nitride;
  one or more layers of spin on glass, and
  a passivation layer over the one or more dielectric layers.

The membrane may be formed by back-etching using Deep Reactive Ion Etching (DRIE) of the substrate, which results in vertical sidewalls. The back-etching can also be performed using anisotropic etching such as KOH (Potassium Hydroxide) or TMAH (TetraMethyl Ammonium Hydroxide) which result in slopping sidewalls.

The membrane can also be formed by a front-side etch to result in a suspended membrane structure, supported by at least two or more beams.

The starting substrate can be silicon, or silicon on insulator (SOI) or any semiconductor, besides silicon, such as Silicon Carbide, Gallium Arsenide or Gallium nitride or a combination of those together with silicon.

The device is preferably fabricated using CMOS-based or CMOS-usable materials. Here the terms "CMOS-based" material or "CMOS-usable" material refer to the materials which are compatible in the state-of-art CMOS processing steps or CMOS process. In this example the metals used maybe CMOS materials such as tungsten, aluminium, copper, titanium, molybdenum. Silicon, polysilicon and silicides can also be used to form various IR detectors or for the tracks/layers within the separator regions to isolate the pixels.

Alternatively the device may also be fabricated with some or all non-CMOS materials. The metals used may comprise platinum or gold. The IR detector material may comprise other materials such as vanadium oxide, or various silicides, including magnesium silicide.

The dielectric membrane itself may be circular, rectangular, or rectangular shaped with rounded corners to reduce the stresses in the corners, but other shapes are possible as well. There may also be holes on each pixel of the membrane to improve the response of each pixel.

There can also be several membranes on one chip, with each membrane having an array of IR detectors.

The array can also have circuitry integrated on the same chip. The circuitry can comprise switches, multiplexer, decoder, filter, amplifier, analogue to digital converter, and/or other circuitry. This will typically be outside the membrane area.

Additionally, there can also be pixel addressing circuitry within the membrane. If using SOI technology, then the thin silicon layer will be on the membrane and can be used for circuitry within the heat sink region. The simplest circuit can comprise a FET switch. More complicated circuits using amplifiers or buffers are also possible.

In non-SOI technology, polysilicon diodes can be used to address the appropriate pixel.

The arrays may also have plasmonic structures on them to improve the absorbance at preferred wavelengths or filter out specific unwanted wavelengths or bands of wavelengths. These structures could be made of metal such as tungsten, aluminium, copper, titanium, molybdenum, gold or platinum, silicides or polysilicon or single crystal silicon, and are periodically repeated in a lateral direction. The structures can be circle, ellipse, rectangular, trapezoid, or any other shape or combination of different shapes. The structures can be dots of these shapes or holes of these shapes within the layer. The repeat pattern can be hexagonal or square. The structures can be in more than one layer. All the pixels in the array may have an identical plasmonic structure, or the plasmonic structure can be different for different pixels. There may also be some pixels with plasmonic structures and some without.

The device maybe packaged in a metal TO type package. The device can also be packaged in a ceramic, metal or plastic SMD (surface mount device) package. The package may have one or more IR filters or windows, or a filter whose characteristics vary laterally. The package maybe hermetically or semi-hermetically sealed with air, dry air, argon, nitrogen, xenon or any other noble gas. The device may also be packaged in a vacuum. The device may also be packaged with a lens. The device may also be packaged with a reflector. The package can also be a chip or wafer level package, formed for example, by wafer-bonding an etched wafer/chip on top, with the etched wafer/chip having a portion that is transparent to at least some wavelengths of IR. The device can also be packaged directly on a PCB, or be packaged in a flip-chip method.

The device can also have an IR emitter fabricated on the same chip. The IR emitter can be on a separate membrane, and may comprise a heater made of tungsten, aluminium, copper, polysilicon, single crystal silicon, titanium, platinum, or gold. The IR emitter may also have one or more plasmonic patterned layer within or on one side of the membrane.

The array of IR detectors can be used in portable electronic devices, buildings or in automobiles. Some or all of the signal processing can by performed by the circuitry on-chip, or on a chip co-packaged with the detector, or a chip on the same PCB, or within the device, or maybe processed at a remote device or system.

According to a further aspect of the present invention there is provided a method of manufacturing an infra-red (IR) detector array device, the method comprising:
   forming a semiconductor substrate;
   depositing or growing one or more layers of polysilicon and/or metals and dielectric layers to form a two dimensional array of IR detectors and a plurality of separator regions;
   bulk etching the semiconductor substrate to form a dielectric membrane,
   wherein at least some of the plurality of IR detectors are formed on or within the dielectric membrane, and wherein said at least some of the plurality of IR detectors are separated from one another by at least some of said plurality of separator regions.

The semiconductor substrate may be a plain substrate such as silicon substrate or a layered substrate such as a silicon on insulator (SOI) substrate.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
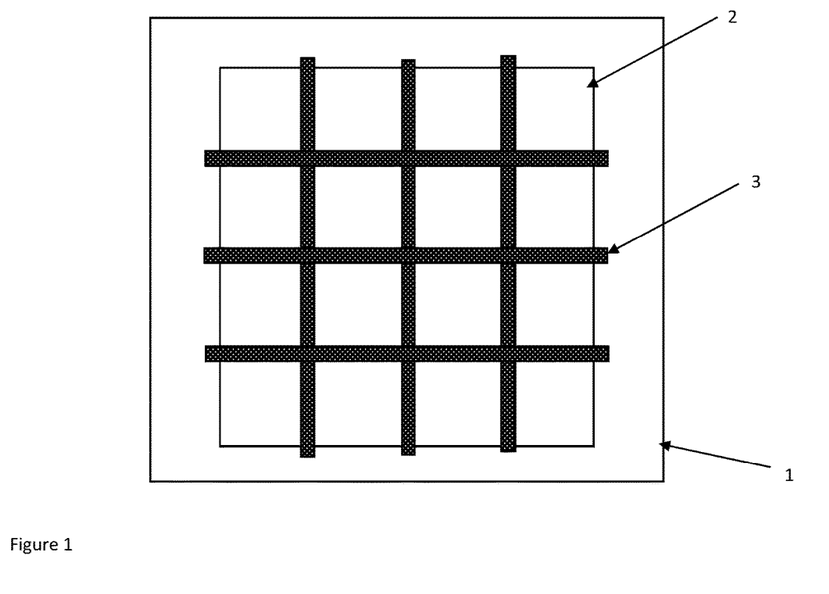
FIG. 1 shows a schematic top view of a dielectric membrane with separations.

FIG. 1 shows a schematic top-view of a chip 1, with a membrane 2 having separations 3 within it. The separations or separator regions 3 are made from material embedded within the membrane layers and may comprise metal, silicon or polysilicon. The membrane is a dielectric membrane and may comprise one or more layers of silicon dioxide and/or silicon nitride. The separations can also act to define each pixel in the array.

Figure 2:
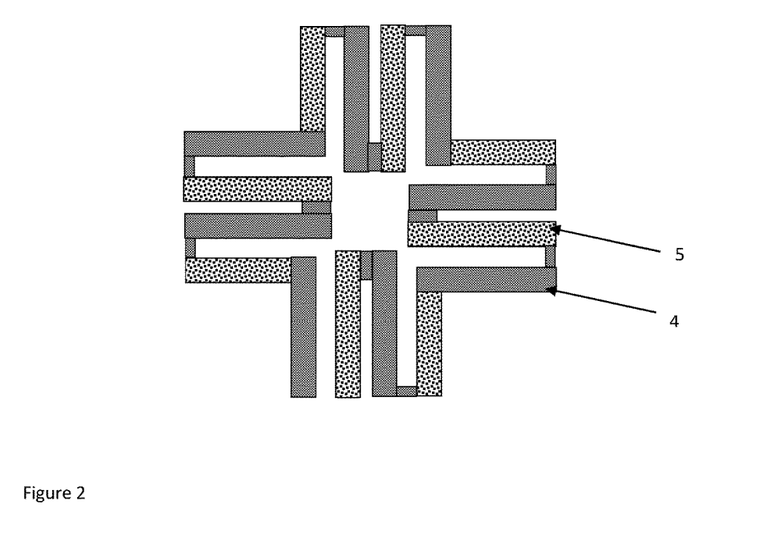
FIG. 2 shows a schematic top-view a thermopile structure.

FIG. 2 shows a schematic top-view of a thermopile comprising two different materials 4 and 5. The materials can be metal, or doped polysilicon or doped single crystal silicon.

Figure 3:
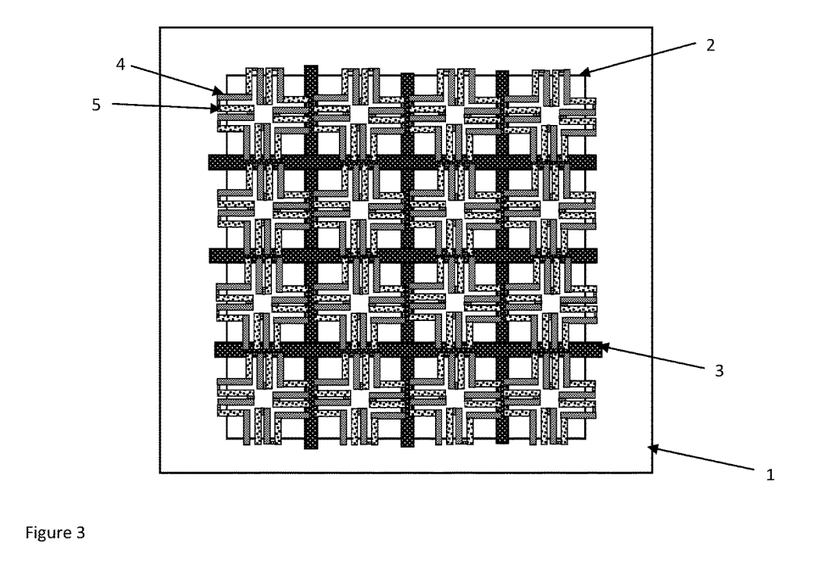
FIG. 3 shows the schematic top-view of an array of thermopile based IR detectors all on the same membrane with separations.

FIG. 3 shows a schematic top-view of an IR detector array based on thermopiles, with the whole array on a single membrane 2. This combines structures from FIGS. 1 and 2. Each IR detector element is separated by a material 3 embedded within the membrane, which acts as a heat sink and cold junction area. The separation 3 allows isolation between each pixel. For the pixels on the edge of the membrane, some of the thermopile cold junctions are on the substrate. The two different materials 4 and 5 form two types of junctions: the hot junctions are formed within the pixel area, while the cold junctions are formed on the separator region, or on the substrate (for pixels on the edge of the membrane). The temperature difference between the hot and cold junctions allows the IR detection.

As can be seen, the middle four pixels use the separator region to form the cold junction, and the cold junction is formed on the membrane, not the substrate. This reduces the need for more membranes, and hence results in smaller chip area and lower cost. This is applicable for any two dimensional array of 3×3 or larger size where there is at least one pixel without direct contact to the substrate.

Figure 4:
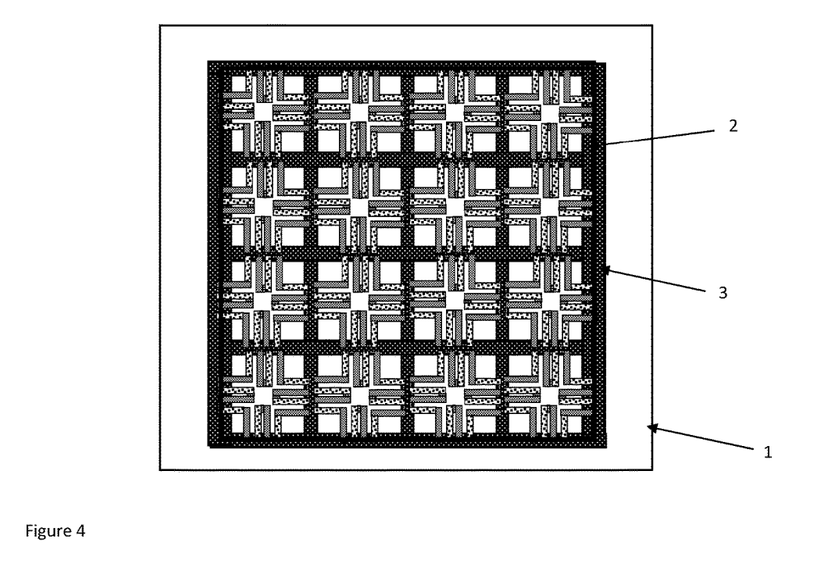
FIG. 4 shows the schematic top-view of an array of thermopile based IR detectors all on the same membrane with separations, and also having the separating material at the border of the membrane.

FIG. 4 shows a schematic top-view of an IR detector array based on thermopiles, with the whole array on a single membrane 2, each pixel separated by a material 3 embedded within the membrane. Additionally, this separation material is also at the edge of the substrate—to make the whole structure a bit more symmetrical.

Figure 5:
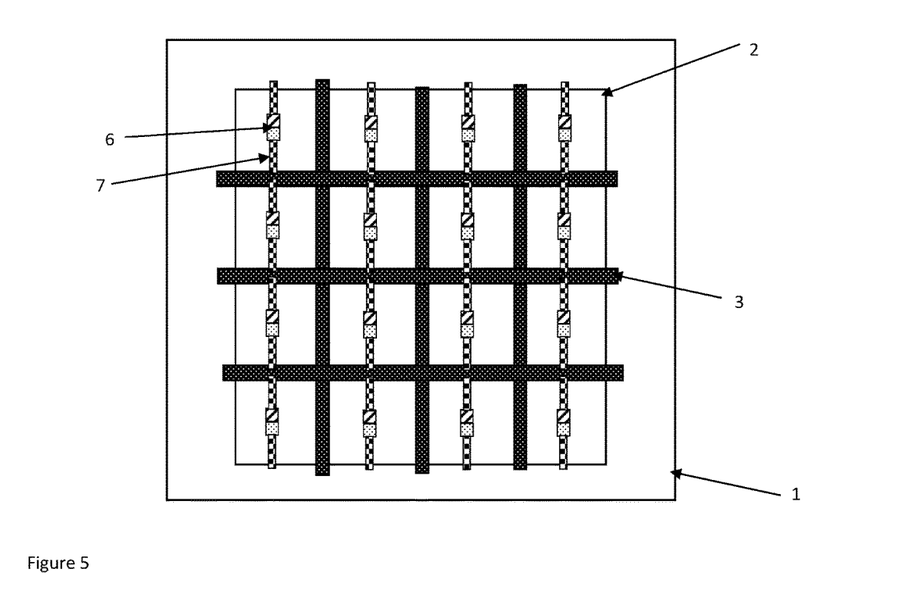
FIG. 5 shows the schematic top-view of an array of diode based IR detectors all on the same membrane with separations.

FIG. 5 shows a schematic top-view of an IR detector array based on diodes, with the whole array on a single membrane 2. Each pixel comprises a diode 6, and tracks 7 which are used to electrically connect the diode. Each pixel is separated by use of a separator 3 embedded within the membrane. The diode can be made of polysilicon or single crystal silicon.

Figure 6:
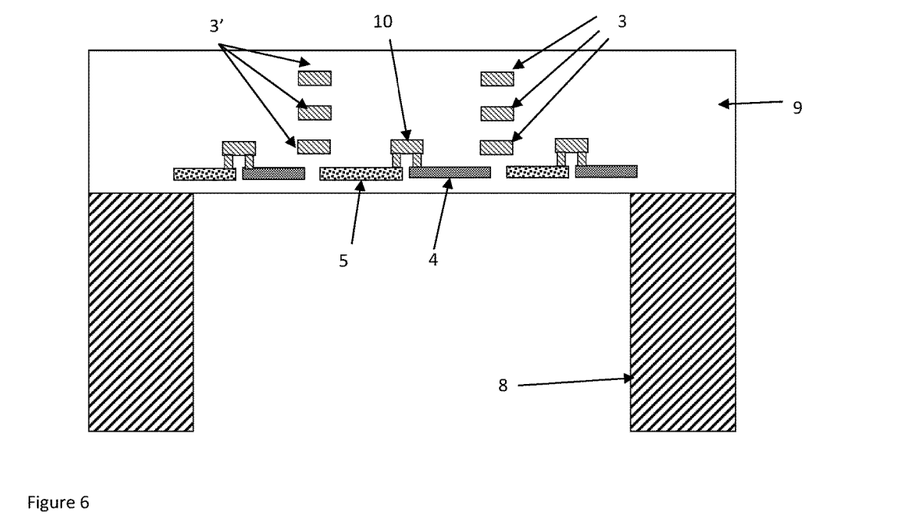
FIG. 6 shows the schematic cross-section of an array of thermopile based IR detectors, with metal embedded within the membrane acting as a separation.

FIG. 6 shows the schematic cross-section of an IR detector array based on thermopile with the whole array on a single membrane. The membrane is supported on an etched substrate 8, and comprises dielectric layers 9 and may comprise one or more layers of silicon dioxide and/or silicon nitride. The thermopiles comprise p-doped silicon 4, and n-doped silicon 5, and a metal 10 is used to form a junction between them. Metal layers 3 are used to form a first separator region between the thermopiles and further metal layers 3' are used to form a second separator region between further thermopiles. This separation area also acts as a heat sink and/or cold junction area.

The thermopiles materials can comprise many other configurations, for example, n-doped silicon and metal, or p-doped silicon and metal. The silicon for the thermopiles can be polysilicon or single crystal silicon. The separation 3, while made of metal in this figure, can also be made from single crystal silicon or polysilicon, or may comprise metal, polysilicon and/or single crystal silicon. The substrate in this example is etched by Deep Reactive Ion Etching (DRIE) which results in vertical sidewalls.

Figure 7:
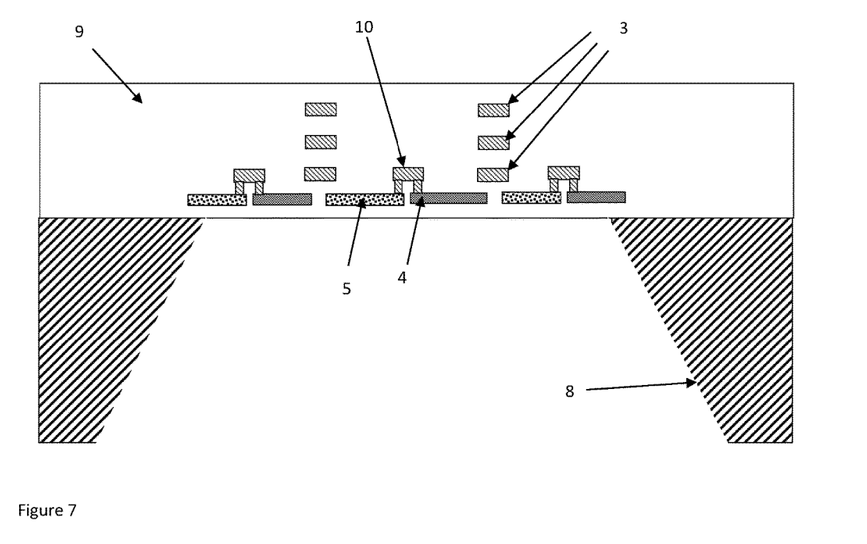
FIG. 7 shows the schematic cross-section of an array of thermopile based IR detectors, with a metal embedded within the membrane acting as a separation, where the membrane trench has sloping side-walls.

FIG. 7 shows a thermopile based IR detector array on a single membrane, where the substrate has been etched by anisotropic method such as KOH or TMAH resulting in sloping sidewalls.

Figure 8:
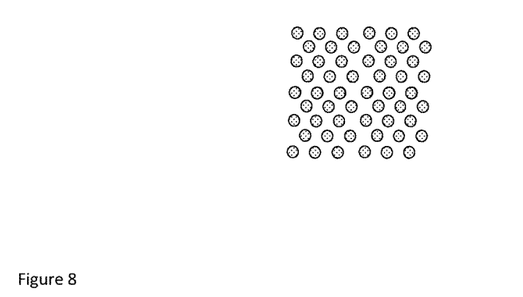
FIG. 8 shows an example pattern arrangement of a plasmonic type structure that can be used to improve the absorption at certain wavelengths.

FIG. 8 shows a plasmonic patterning on metal. The pattern comprises a shape repeated periodically in a hexagonal repeat pattern. Using this patterning within an IR detector can improve the absorbance of the detector. The pattern can alternately be a square repeat pattern. Alternately, the shape being repeated can be a rectangle, ellipse, trapezoid, star or any other shape.

Figure 9:
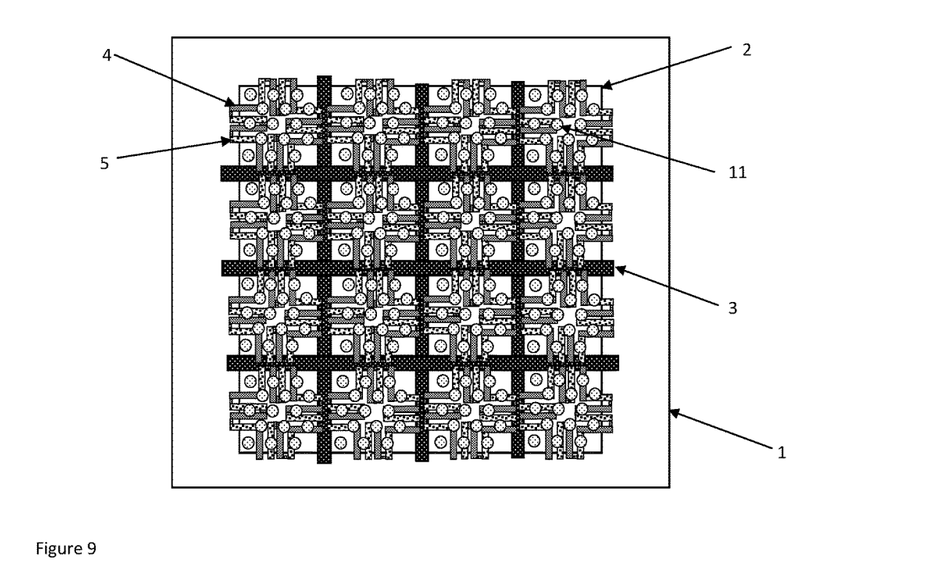
FIG. 9 shows the schematic top-view of an array of thermopile based IR detectors all on the same membrane with separations, and having a patterned layer on each detector to improve the absorbance.

FIG. 9 shows the schematic top-view of a thermopile based IR detector array with plasmonic structures 11 on each detector. The figure shows identical plasmonic structures on each array. However, the plasmonic structures can be different on each pixel as well. Additionally not all the pixels may have the plasmonic structures.

Figure 10:
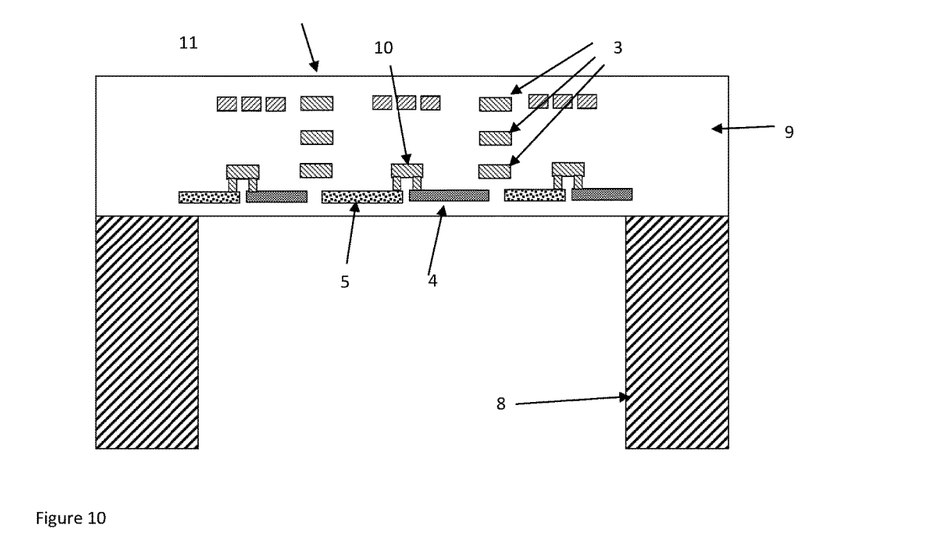
FIG. 10 shows the schematic cross-section of an array of thermopile based IR detectors, with metal embedded within the membrane acting as a separation, and having a patterned layer above the detector to improve absorbance.

FIG. 10 shows the schematic cross-section on a thermopile based IR detector array, with all the detectors on the same membrane, where there are plasmonic structures 11 above the thermopiles.

Figure 11:
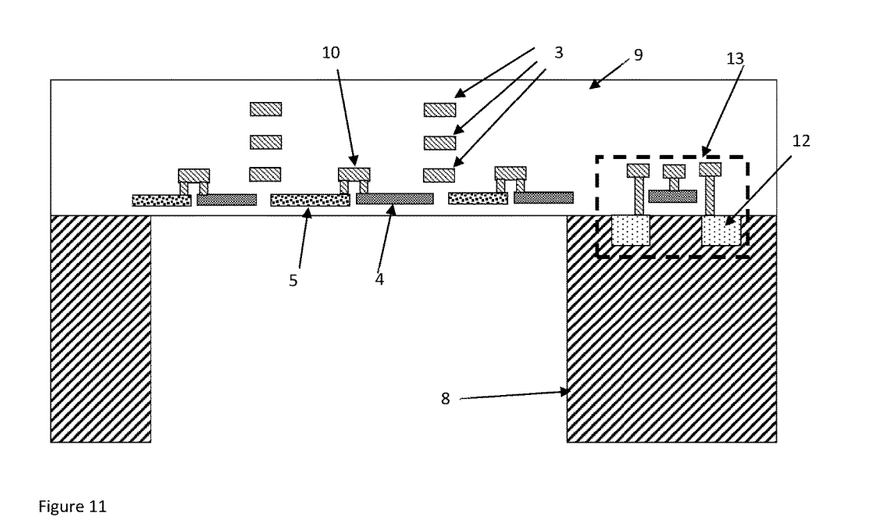
FIG. 11 shows the schematic cross-section of an array of thermopile based IR detectors, with metal embedded within the membrane acting as a separation, with circuitry on the same chip.

FIG. 11 shows a thermopile based IR detector array where there is circuitry on the same chip, outside the membrane area. As an example, a MOSFET 13 is shown, which comprises implant regions 12, a polysilicon gate and interconnect metal.

Figure 12:
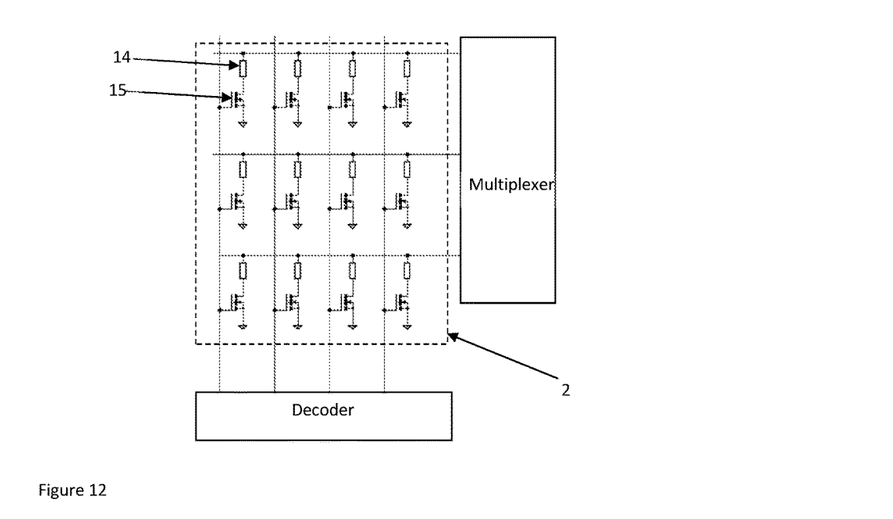
FIGS. 12-15 show different circuit diagrams for addressing the pixels within the array.

FIG. 12 shows an example circuit diagram. Each pixel comprise a MOSFET switch 15 and a detector 14 which can be a thermopile or a resistor. A decoder circuit selects the columns by turning the MOSFET on, while the multiplexer selects between rows. Preferably, the design is made in an SOI process to fabricate the MOSFETs on the membrane.

Figure 13:
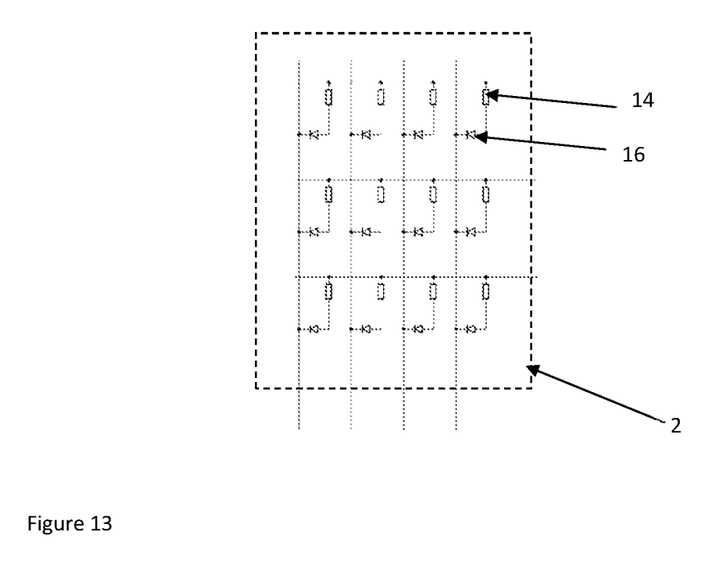

FIG. 13 shows a circuit diagram, where diodes 16 are used to address each pixel. The column to be selected has to be set to a low voltage, and a multiplexing circuit can be used to select the row. The diodes can be made from either single crystal silicon or polysilicon.

Figure 14:
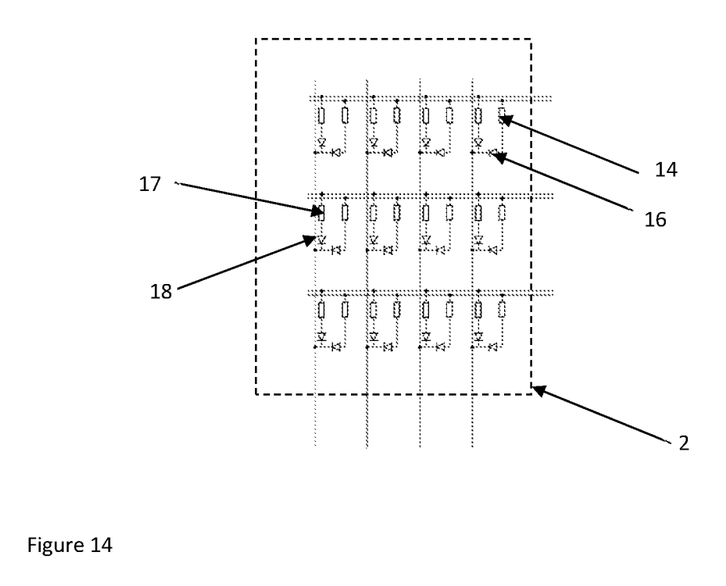

FIG. 14 shows a circuit diagram where diodes are used to address each pixel, where each pixel also has a reference diode 18 and a reference thermopile/resistor 17. These can be placed within the cold junction area of the membrane. The reference elements help to improve the signal for each detector.

Figure 15:
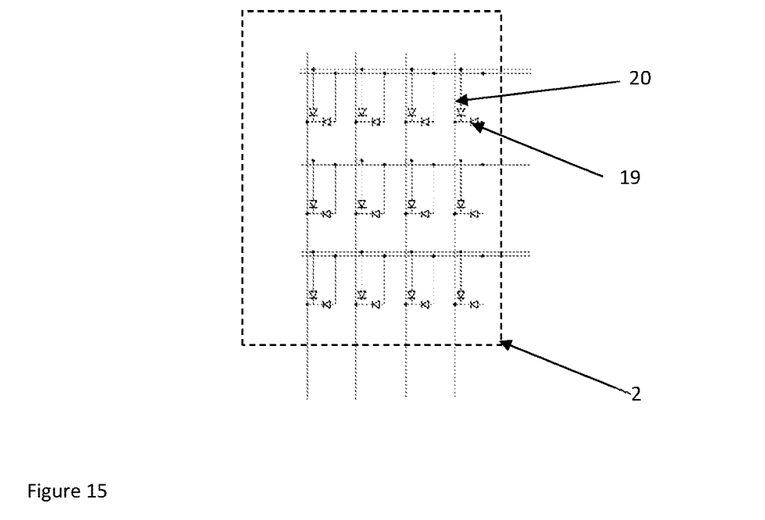

FIG. 15 shows a circuit diagram where the IR detector is based on diodes 19. In this embodiment, each pixel also has a reference diode 20 within the cold junction area, and these can also be addressed by a column decoder and a row multiplexer circuit.

Figure 16:
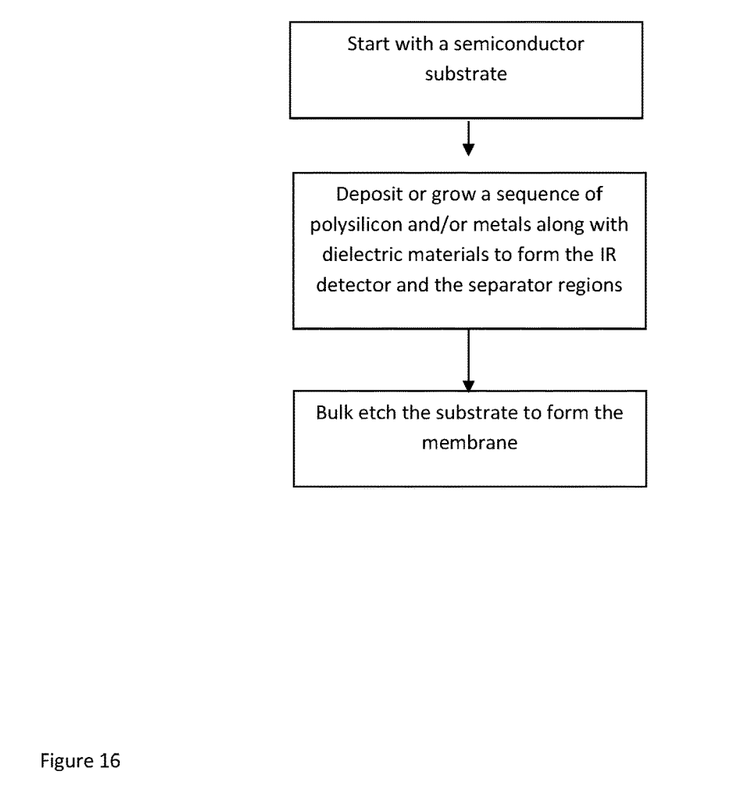
FIG. 16 illustrates an exemplary flow diagram outlining the manufacturing method of the IR detector array device.

FIG. 16 illustrates an exemplary flow diagram outlining the manufacturing method of the IR detector array device.

The skilled person will understand that in the preceding description and appended claims, positional terms such as 'above', 'overlap', 'under', 'lateral', etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above could be reversed, the resulting devices still being in accordance with embodiments of the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. An infra-red (IR) detector array device comprising:
a two dimensional array of a plurality of pixels;
a dielectric region formed on a semiconductor substrate which comprises an etched cavity portion;
a single dielectric membrane formed within the dielectric region, the single dielectric membrane comprising a membrane area which is directly on top of a single etched cavity portion of the substrate; and
a plurality of separator regions formed within the single dielectric membrane;
wherein at least some of the plurality of pixels are formed on or within the single dielectric membrane directly on top of the single etched cavity portion, and wherein said at least some of the plurality of pixels are separated from one another by at least some of said plurality of separator regions.

2. A device according to claim 1, wherein the separator regions comprise at least one layer which is thermally more conductive than said single dielectric membrane.

3. A device according to claim 2, further comprising further separator regions formed on top and/or below the dielectric membrane.

4. A device according to claim 1, wherein the two dimensional array of the plurality of pixels comprises at least a 3 by 3 array.

5. A device according to claim 1, wherein the separator regions are two dimensionally formed within the single dielectric membrane.

6. A device according to claim 1, wherein the separator regions comprise at least two first separator regions extending in a first direction and at least two second separator regions extending in a second direction transverse to the first direction, the second separator regions intersecting the first separator regions.

7. A device according to claim 6, wherein said at least some of the plurality of pixels are thermally separated from one another by said at least two first separator regions and by said at least two second separator regions.

8. A device according to claim 6, wherein two adjacent pixels are separated from one another by the first and/or second separator regions.

9. A device according to claim 6, wherein some of said at least of some of the pixels are not separated from one another by the first and second separator regions.

10. A device according to claim 1, wherein the separator regions each comprise at least one separator layer.

11. A device according to claim 10, wherein said at least one separator layer comprises at least one layer of metal, polysilicon and/or single crystal silicon.

12. A device according to claim 10, wherein said at least one separator layer comprises at least one layer of interconnect material to connect the pixels within the array of the pixels.

13. A device according to claim 12, wherein the size of each pixel is in a range from about 2 μm by 2 μm to about 600 μm by 600 μm.

14. A device according to claim 13, wherein the size of each pixel within the array is different from one another.

15. A device according to claim 1, wherein each pixel comprises a plurality of IR detectors.

16. A device according to claim 15, further comprising holes on each or some of the pixels.

17. A device according to claim 1, wherein the separator regions each provide thermal isolation between each pixel of the device.

18. A device according to claim 1, wherein each separator region is a heat sink region.

19. A device according to claim 1, wherein the pixels comprise any one or more of a thermopile, a resistor, transistor and a diode.

20. A device according to claim 1, wherein each pixel comprises a thermopile.

21. A device according to claim 20, wherein each thermocouple within the thermopile comprises at least first and second dissimilar materials.

22. A device according to claim 21, wherein at least one of the first and second materials comprises metal comprising aluminium, copper, tungsten, titanium or combination of these materials.

23. A device according to claim 21, wherein at least one of the first and second materials comprises N+ or P+ doped polysilicon, or vanadium oxide or tungsten silicide, or N+ or P+ doped single crystal silicon.

24. A device according to claim 20, wherein each thermocouple further comprises a first thermal junction, and a connection to an adjacent thermocouple forms a second thermal junction, the first thermal junction being a hot junction and the second thermal junction being a cold junction.

25. A device according to claim 24, wherein the hot junction is located inside the pixel and the cold junction is located on the separator region, or outside the dielectric membrane.

26. A device according to claim 1, wherein each pixel comprises at least one diode, wherein said at least one diode is located in the centre of the pixel, wherein said at least one diode comprises a material comprising polysilicon or single crystal silicon.

27. A device according to claim 26, wherein each pixel further comprises a reference diode coupled within the separator regions.

28. A device according to claim 1, wherein each pixel comprises at least one transistor, wherein said at least one transistor is located in the centre of the pixel, wherein said at least one transistor comprises a material comprising single crystal silicon.

29. A device according to claim 1, wherein each pixel comprises at least one resistor, wherein said at least one resistor is located in the centre of the pixel.

30. A device according to claim 29, wherein said at least one resistor comprises a material comprising:
metal comprising aluminium, copper, tungsten, titanium, and/or platinum;

n or p type polysilicon; and/or
n or p type single crystal silicon.

31. A device according to claim 29, wherein each pixel further comprises a reference resistor located within the separator regions.

32. A device according to claim 1, wherein each pixel comprises a thermopile in which Seeback effect and resistance change effect are used to determine IR radiation.

33. A device according to claim 1, wherein each pixel comprises a thermopile coupled with a reference diode located at the separator regions to determine a cold junction temperature estimation which is used to determine an absolute hot junction temperature.

34. A device according to claim 1, wherein the single dielectric membrane comprises:
a membrane cavity comprising vertical side walls or sloping side walls;
one or more dielectric layers comprising silicon dioxide and/or silicon nitride;
one or more layers of spin on glass, and
a passivation layer over the one or more dielectric layers.

35. A device according to claim 1, wherein the single dielectric membrane is formed by any one of:
back-etching using Deep Reactive Ion Etching (DRIE) of the substrate, and
using anisotropic etching such as Potassium Hydroxide (KOH) or TetraMethyl Ammonium Hydroxide (TMAH).

36. A device according to claim 1, wherein the single dielectric membrane is formed by a front-side etch to result in a suspended membrane structure, supported by at least two beams.

37. A device according to claim 1, wherein the substrate comprises any one of:
silicon;
silicon on insulator;
silicon carbide;
gallium arsenide;
gallium nitride; and/or
a combination of silicon carbide, gallium arsenide, gallium nitride with silicon.

38. A device according to claim 1, wherein the device is fabricated using a CMOS-usable metal selected from a group comprising tungsten, copper, aluminium, titanium, and molybdenum.

39. A device according to claim 1, wherein the pixels and the separator regions are formed using a CMOS-usable material selected from a group comprising Silicon, polysilicon and silicides.

40. A device according to claim 1, wherein the device is fabricated using a non-CMOS material.

41. A device according to claim 1, further comprising circuitry integrated on the same chip, wherein the circuitry comprise any one of switches, multiplexer, decoder, filter, amplifier, analogue to digital converter, and/or other circuitry.

42. A device according to claim 41, wherein the circuitry is placed outside the single dielectric membrane area.

43. A device according to claim 1, further comprising pixel addressing circuitry on or within the single dielectric membrane.

44. A device according to claim 43, where the pixel addressing circuitry comprises diodes made in polysilicon or single crystal silicon, and comprises a reference diode and/or a detector within the separator region.

45. A device according to claim 1, further comprising pixel circuitry integrated on the membrane using a silicon on insulator (SOI) technology, wherein the circuitry comprises any one of a MOSFET, a buffer and an amplifier for each pixel of the device.

46. A device according to claim 1, wherein the separator regions within the single dielectric membrane extend at least partly over the etched substrate.

47. A device according to claim 1, further comprising at least one plasmonic structure on at least some of the pixels.

48. A device according to claim 47, wherein said at least one plasmonic structure comprises metal comprising any one of tungsten, aluminium, copper, titanium, molybdenum, gold, platinum, or comprising silicides such as magnesium silicide or tungsten silicide, or polysilicon, single crystal silicon.

49. A device according to claim 47, wherein said at least one plasmonic structure comprises a structure repeated periodically in a lateral direction forming a repeat pattern, wherein the repeat pattern comprises a hexagonal or square shape.

50. A device according to claim 47, wherein said at least one plasmonic structure comprises a circle, ellipse, rectangular, trapezoid or a combination of different shapes, or as a pattern of holes of one or more shapes within a layer.

51. A device according to claim 47, wherein said at least one plasmonic structure on each pixel comprises an identical shape or a different shape.

52. A device according to claim 1, wherein the device is packaged using one or more of:
a metal transistor output (TO) type package;
a ceramic, metal or plastic surface mount package;
IR filters;
a reflector;
a flip-chip method;
a chip or wafer level package;
a lens;
a printed circuity board (PCB).

53. A device according to claim 52, wherein the package is hermetically or semi-hermetically sealed with air, dry air, argon, nitrogen, xenon or any other noble gas; and/or the device is packaged in vacuum.

54. A device according to claim 1, further comprising an IR emitter formed on the same chip.

55. A device according to claim 1, further comprising a coating layer formed on top or back of the single dielectric membrane, wherein the coating layer comprises carbon-black, polymer or metal black.

56. An infra-red (IR) detector array assembly comprising:
a plurality of IR detector array devices according to claim 1, wherein said plurality of array devices are formed on the same chip.

57. A device according to claim 1, wherein at least one pixel is without a direct contact to the semiconductor substrate.

58. A method of manufacturing an infra-red (IR) detector array device, the method comprising:
forming a semiconductor substrate;
depositing one or more layers of polysilicon and/or metals and dielectric layers to form a two dimensional array of IR detectors and to form a plurality of separator regions;
bulk etching the semiconductor substrate to form a dielectric membrane, the single dielectric membrane comprising a membrane area which is directly on top of a single etched cavity portion of the substitute,
wherein at least some of the plurality of pixels are formed on or within the single dielectric membrane, directly on top of the single etched cavity portion and wherein said at least some of the plurality of pixels are separated from one another by at least some of said plurality of separator regions.

59. A method according to claim 58, wherein the separator regions comprise at least one layer which is thermally more conductive than said single dielectric membrane.

60. A method according to claim 58, wherein the semiconductor substrate comprises a plain substrate comprising silicon, or a layered substrate comprising silicon on insulator (SOI) layers.

* * * * *